United States Patent
Minemura

(10) Patent No.: US 9,806,092 B1
(45) Date of Patent: Oct. 31, 2017

(54) SEMICONDUCTOR MEMORY DEVICE AND METHODS FOR MANUFACTURING THE SAME

(71) Applicant: Toshiba Memory Corporation, Minato-ku (JP)

(72) Inventor: Yoichi Minemura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/461,590

(22) Filed: Mar. 17, 2017

Related U.S. Application Data

(60) Provisional application No. 62/393,145, filed on Sep. 12, 2016.

(51) Int. Cl.

| | | |
|---|---|---|
| H01L 27/115 | (2017.01) | |
| H01L 27/11565 | (2017.01) | |
| H01L 27/11524 | (2017.01) | |
| H01L 27/11556 | (2017.01) | |
| H01L 27/11519 | (2017.01) | |
| H01L 27/1157 | (2017.01) | |
| H01L 27/11582 | (2017.01) | |
| H01L 21/768 | (2006.01) | |
| H01L 21/8234 | (2006.01) | |

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11556* (2013.01); *H01L 27/11582* (2013.01); *H01L 21/76877* (2013.01); *H01L 21/823487* (2013.01)

(58) Field of Classification Search
CPC ......... H01L 27/11582; H01L 21/76877; H01L 21/823487
USPC ........................................ 257/330; 438/270
See application file for complete search history.

(56) References Cited

U.S. PATENT DOCUMENTS 8,395,206 B2    3/2013  Lee et al.
9,627,400 B2 *  4/2017  Koshiishi .......... H01L 27/11582
(Continued)

FOREIGN PATENT DOCUMENTS

JP     2011-66417    3/2011
JP     2014-120735   6/2014

*Primary Examiner* — George Fourson, III
(74) *Attorney, Agent, or Firm* — Oblon, McClelland, Maier & Neustadt, L.L.P.

(57) ABSTRACT

According to one embodiment, a semiconductor memory device includes first to fourth conductive layers, a first intermediate insulating layer, a second intermediate insulating layer, an inter-layer insulating layer, a first semiconductor body, a first memory layer, a second semiconductor body, a second memory layer, and a first interconnect. The second conductive layer is separated from the first conductive layer in a first direction. The third conductive layer is arranged with the first conductive layer in a second direction crossing the first direction. The fourth conductive layer is separated from the third conductive layer in the first direction and arranged with the second conductive layer in the second direction. The first intermediate insulating layer is provided between the first conductive layer and the third conductive layer. The second intermediate insulating layer is provided between the second conductive layer and the fourth conductive layer.

20 Claims, 10 Drawing Sheets

(56) References Cited

U.S. PATENT DOCUMENTS

| | | | |
|---|---|---|---|
| 2010/0133599 A1* | 6/2010 | Chae | H01L 27/11578 257/315 |
| 2011/0065270 A1 | 3/2011 | Shim et al. | |
| 2012/0043673 A1* | 2/2012 | Chang | H01L 27/11551 257/786 |
| 2012/0199897 A1* | 8/2012 | Chang | H01L 21/8221 257/314 |
| 2014/0162420 A1* | 6/2014 | Oh | H01L 27/11565 438/270 |
| 2014/0167133 A1 | 6/2014 | Hirano et al. | |
| 2015/0061155 A1* | 3/2015 | Seo | H01L 29/16 257/774 |
| 2016/0013203 A1* | 1/2016 | Eom | H01L 27/11582 257/314 |
| 2016/0163731 A1* | 6/2016 | Tan | H01L 29/0638 257/324 |

* cited by examiner

SEMICONDUCTOR MEMORY DEVICE AND METHODS FOR MANUFACTURING THE SAME

CROSS-REFERENCE TO RELATED APPLICATIONS

This application is based upon and claims the benefit of priority from U.S. Provisional Patent Application 62/393,145, filed on Sep. 12, 2016; the entire contents of which are incorporated herein by reference.

FIELD

Embodiments described later relate generally to a semiconductor memory device and a method for manufacturing the same.

BACKGROUND

Operations having high reliability are desirable in a semiconductor memory device.

DETAILED DESCRIPTION

Figure 1:
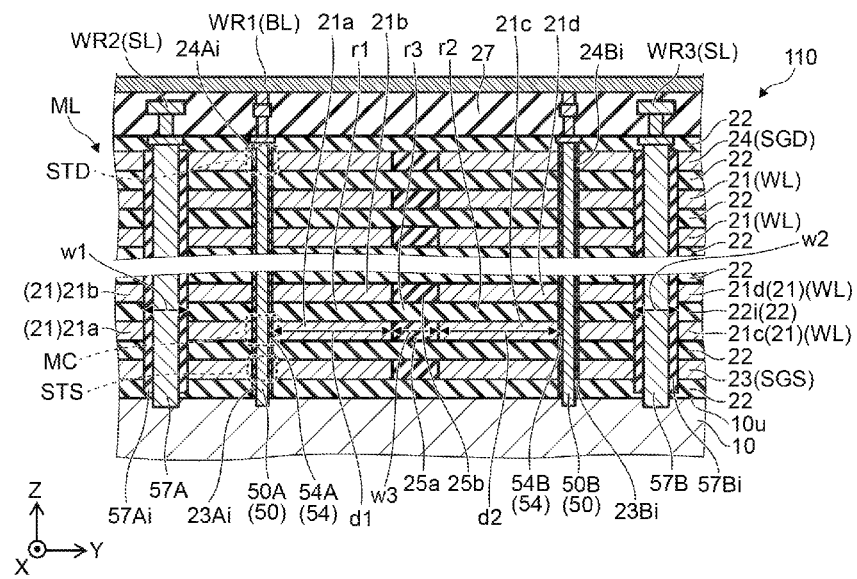
FIG. 1 is a schematic cross-sectional view illustrating a semiconductor memory device according to a first embodiment.

According to one embodiment, a semiconductor memory device includes first to fourth conductive layers, a first intermediate insulating layer, a second intermediate insulating layer, an inter-layer insulating layer, a first semiconductor body, a first memory layer, a second semiconductor body, a second memory layer, and a first interconnect. The second conductive layer is separated from the first conductive layer in a first direction. The third conductive layer is arranged with the first conductive layer in a second direction crossing the first direction. The fourth conductive layer is separated from the third conductive layer in the first direction and arranged with the second conductive layer in the second direction. The first intermediate insulating layer is provided between the first conductive layer and the third conductive layer. The second intermediate insulating layer is provided between the second conductive layer and the fourth conductive layer. The inter-layer insulating layer includes an intermediate partial region between the first intermediate insulating layer and the second intermediate insulating layer. The first semiconductor body extends through the first conductive layer and the second conductive layer in the first direction. The first memory layer is provided between the first conductive layer and the first semiconductor body. The second semiconductor body extends through the third conductive layer and the fourth conductive layer in the first direction. The second memory layer is provided between the third conductive layer and the second semiconductor body. The first interconnect is electrically connected to the first semiconductor body and the second semiconductor body. At least one of the first intermediate insulating layer or the second intermediate insulating layer includes a material different from a material of the intermediate partial region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor memory device according to a first embodiment.

As shown in FIG. 1, the semiconductor memory device 110 according to the embodiment includes first to fourth conductive layers 21a to 21d, a first intermediate insulating layer 25a, a second intermediate insulating layer 25b, an inter-layer insulating layer 22i, a first semiconductor body 50A, a second semiconductor body 50B, a first memory layer 54A, a second memory layer 54B, and a first interconnect WR1.

The second conductive layer 21b is separated from the first conductive layer 21a in a direction.

The direction is taken as a Z-axis direction. One direction perpendicular to the Z-axis direction is taken as an X-axis direction. A direction perpendicular to the Z-axis direction and the X-axis direction is taken as a Y-axis direction.

A base semiconductor layer 10 is provided in the example. For example, the base semiconductor layer 10 is at least a portion of a semiconductor substrate (e.g., a silicon substrate). An upper surface 10u of the base semiconductor layer 10 spreads substantially along the X-Y plane. The Z-axis direction is substantially perpendicular to the upper surface 10u.

The third conductive layer 21c is arranged with the first conductive layer 21a in an other direction. The other direction crosses the Z-axis direction. In the example, the other direction is the Y-axis direction. For example, the third conductive layer 21c is separated from the first conductive layer 21a in the Y-axis direction.

The fourth conductive layer 21d is separated from the third conductive layer 21c in the Z-axis direction and is arranged with the second conductive layer 21b in the Y-axis direction. For example, the fourth conductive layer 21d is separated from the second conductive layer 21b in the Y-axis direction.

The first intermediate insulating layer 25a is provided between the first conductive layer 21a and the third conductive layer 21c in the Y-axis direction.

The second intermediate insulating layer 25b is provided between the second conductive layer 21b and the fourth conductive layer 21d in the Y-axis direction.

The inter-layer insulating layer 22i includes a portion (an intermediate partial region r3) provided between the first intermediate insulating layer 25a and the second intermediate insulating layer 25b. In the example, the inter-layer insulating layer 22i further includes a first partial region r1 and a second partial region r2. The first partial region r1 is provided between the first conductive layer 21a and the second conductive layer 21b. The second partial region r2 is provided between the third conductive layer 21c and the fourth conductive layer 21d. For example, the intermediate partial region r3 is continuous with the first partial region r1 and continuous with the second partial region r2.

The first semiconductor body 50A extends through the first conductive layer 21a and the second conductive layer 21b in the Z-axis direction. Further, the first semiconductor body 50A extends through the first partial region r1 in the Z-axis direction. The first memory layer 54A is provided between the first conductive layer 21a and the first semiconductor body 50A and between the second conductive layer 21b and the first semiconductor body 50A.

The second semiconductor body 50B extends through the third conductive layer 21c and the fourth conductive layer 21d in the Z-axis direction. Further, the second semiconductor body 50B extends through the second partial region r2 in the Z-axis direction. The second memory layer 54B is provided between the third conductive layer 21c and the second semiconductor body 50B and between the fourth conductive layer 21d and the second semiconductor body 50B.

The first interconnect WR1 is electrically connected to the first semiconductor body 50A and the second semiconductor body 50B.

In the state in which a first conductor is electrically connected to a second conductor, a state can be formed in which a current flows between these conductors.

In the semiconductor memory device 110 as recited above, a stacked body ML is provided on the base semiconductor layer 10. The stacked body ML includes multiple conductive layers 21 and multiple insulating layers 22 arranged alternately. A portion of the multiple conductive layers 21 corresponds to the first to fourth conductive layers 21a to 21d recited above. One of the multiple insulating layers 22 corresponds to the inter-layer insulating layer 22i recited above. For example, the multiple conductive layers 21 are used as word lines WL of the semiconductor memory device 110.

The stacked body ML further includes a conductive layer 23 and a conductive layer 24. The conductive layer 23 is provided between the base semiconductor layer 10 and the multiple conductive layers 21 (the word lines WL). The multiple conductive layers 21 are provided between the conductive layer 24 and the conductive layer 23. The insulating layer 22 is provided at the position of each region between the conductive layer 23, the multiple conductive layers 21, and the conductive layer 24. For example, the conductive layer 23 functions as a source-side selection gate SGS. For example, the conductive layer 24 functions as a drain-side selection gate SGD.

Multiple semiconductor bodies 50 extend through the stacked body ML in the Z-axis direction. For example, the multiple semiconductor bodies 50 have pillar configurations. For example, the multiple semiconductor bodies 50 may have tubular configurations. A portion of the multiple semiconductor bodies 50 corresponds to the first semiconductor body 50A and the second semiconductor body 50B recited above. As described below, other semiconductor bodies 50 may be further provided other than the first semiconductor body 50A and the second semiconductor body 50B. The multiple semiconductor bodies 50 that are connected to the same interconnect (the first interconnect WR1) are the first semiconductor body 50A and the second semiconductor body 50B recited above.

Memory cells MC are formed at the portions where the multiple conductive layers 21 and the multiple semiconductor bodies 50 cross. The multiple memory cells MC are arranged in the Z-axis direction to form one memory string. The multiple memory strings are arranged in a two-dimensional configuration in the X-Y plane. In other words, the multiple memory cells MC are arranged in a three-dimensional configuration.

In the embodiment, at least one of the first intermediate insulating layer 25a or the second intermediate insulating layer 25b includes a material that is different from the material of the intermediate partial region r3. For example, the first intermediate insulating layer 25a and the second intermediate insulating layer 25b include silicon nitride. On the other hand, the intermediate partial region r3 includes silicon oxide. For example, the first partial region r1 and the second partial region r2 also include silicon oxide.

For example, the concentration of nitrogen of at least one of the first intermediate insulating layer 25a or the second intermediate insulating layer 25b is higher than the concentration of nitrogen in the intermediate partial region r3 (e.g., the inter-layer insulating layer 22i). For example, the concentration of oxygen in the intermediate partial region r3 (e.g., the inter-layer insulating layer 22i) is higher than the concentration of oxygen of at least one of the first intermediate insulating layer 25a or the second intermediate insulating layer 25b.

Thus, in the embodiment, the intermediate insulating layer (the first intermediate insulating layer 25a and the second intermediate insulating layer 25b) that include nitrogen are provided between the two conductive layers 21 arranged in the Y-axis direction. Thereby, for example, the electrical characteristics of the memory cells MC stabilize. For example, the fluctuation of the threshold voltage becomes small.

The inventor of the application discovered that the electrical characteristics of the memory cell MC are stabilized by disposing an intermediate insulating layer including nitrogen (e.g., silicon nitride) at the vicinity of the memory cell MC (i.e., the vicinity of the semiconductor body 50 which is at the vicinity of a memory layer 54). The embodiments are based on such a newly-discovered phenomenon. An example of the characteristics of the memory cell MC is described below.

Figure 2:
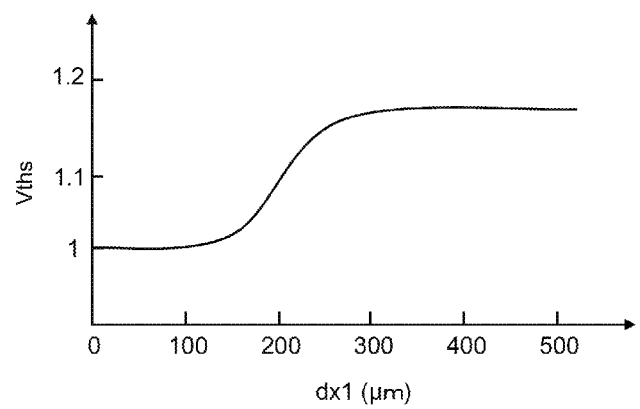
FIG. 2 is a graph illustrating a characteristic of the semiconductor memory device.

FIG. 2 is a graph illustrating a characteristic of the semiconductor memory device.

FIG. 2 illustrates the evaluation result of the threshold voltages of the memory cells MC of the semiconductor memory device. In the semiconductor device, a dummy stacked body is provided to be adjacent to the stacked body ML including the conductive layers 21 and the insulating layers 22. The dummy stacked body includes multiple silicon nitride films and multiple silicon oxide films stacked alternately. The multiple silicon nitride films are arranged respectively with the multiple conductive layers 21 in the X-Y plane and, for example, correspond to the intermediate insulating layers (the first intermediate insulating layer 25a, the second intermediate insulating layer 25b, etc.). The silicon oxide films are arranged with the insulating layers 22 in the X-Y plane. The multiple semiconductor bodies 50 that extend through the stacked body ML in the Z-axis direction are provided. The threshold voltages of the memory cells MC (the memory transistors) formed at the multiple semiconductor bodies 50 are evaluated. The horizontal axis of FIG. 2 is a distance dx1 (μm) between the dummy stacked body recited above and the multiple semiconductor bodies 50. The vertical axis is a threshold voltage Vths. The threshold voltage Vths is displayed as being normalized.

As shown in FIG. 2, it was found that the threshold voltage Vths is low in the memory cells MC where the distance dx1 is short, and the threshold voltage Vths is high in the memory cells where the distance dx1 is long. For example, in the memory cells MC where the distance dx1 is short, it is considered that hydrogen is supplied from the silicon nitride films of the dummy stacked body to the memory cells MC (e.g., the semiconductor body 50, etc.); thereby, the thresholds of the memory cells MC are low. It is considered that the supply of the hydrogen from the silicon nitride films of the dummy stacked body decreases as the distance dx1 lengthens; and as a result, the threshold of the memory cell MC becomes high.

Thus, a low threshold voltage Vths is obtained by disposing the dummy stacked body including the silicon nitride films to be proximal to the memory cell MC. Further, it was found that the current (a current $I_{cell}$) that flows in the semiconductor body 50 also is large when the distance dx1 is short and is small when the distance dx1 is long. Further, it was found that the s-factor of the threshold characteristic (e.g., the gate voltage to increase the drain current 10 times) also is small when the distance dx1 is short and large when the distance dx1 is long. The threshold voltage, the current, and the s-factor are good because the dummy stacked body including the silicon nitride films is disposed to be proximal to the memory cell MC.

As shown in FIG. 2, a good threshold voltage is obtained when the distance dx1 is 200 μm or less. Further, a better threshold voltage is obtained when the distance dx1 is 100 μm or less. Further, a better threshold voltage is obtained when the distance dx1 is 50 μm or less.

In the embodiment, the intermediate insulating layers (the first intermediate insulating layer 25a, the second intermediate insulating layer 25b, etc.) are provided at the vicinity of the memory cells MC. Thereby, for example, good characteristics are obtained for the threshold voltage, the current, and the s-factor.

As recited above, the intermediate insulating layer includes nitrogen and includes, for example, silicon nitride. For example, hydrogen is supplied from the intermediate insulating layer toward the memory cell MC.

In the embodiment, the insulating layers 22 (e.g., the inter-layer insulating layers 22i) may be provided between the multiple intermediate insulating layers (the first intermediate insulating layer 25a, the second intermediate insulating layer 25b, etc.). The multiple intermediate insulating layers and the multiple insulating layers 22 may be stacked alternately. For example, a stacked body that includes silicon nitride films and silicon oxide films is provided at the vicinity of the memory cells MC.

For example, the distance between the multiple semiconductor bodies 50 connected to one bit line BL is relatively short. By disposing the intermediate insulating layers (the first intermediate insulating layer 25a, the second intermediate insulating layer 25b, etc.) between the semiconductor bodies 50 disposed to be proximal to each other, good characteristics are obtained for the threshold voltage, the current, and the s-factor.

For example, in the semiconductor memory device 110, a "plane" is provided as a unit of the memory region. By disposing the intermediate insulating layers (the first intermediate insulating layer 25a, the second intermediate insulating layer 25b, etc.) in the interior of the "plane," good characteristics are obtained for the threshold voltage, the current, and the s-factor.

On the other hand, it may be considered to provide the dummy stacked body of the silicon nitride films and the silicon oxide films outside the "plane." In such a case, the distance from the dummy stacked body is long at the central portion of the "plane;" and it is difficult to obtain effects such as those recited above.

In the embodiment, for example, the intermediate insulating layers are provided in the interior of the "plane." Inside one "plane," the multiple semiconductor bodies 50 are connected to one bit line BL. By disposing the intermediate insulating layers (the first intermediate insulating layer 25a, the second intermediate insulating layer 25b, etc.) between the multiple semiconductor bodies 50 connected to the one bit line BL, the distance between the semiconductor body 50 and the intermediate insulating layer can be short. Thereby, good characteristics are obtained for the threshold voltage, the current, and the s-factor. According to the embodiment, for example, the reliability of the operations can be increased.

In the embodiment, the distance (a first distance d1 referring to FIG. 1) between the first intermediate insulating layer 25a and the first semiconductor body 50A is 200 micrometers (μm) or less. The first distance d1 may be 100 μm or less. The first distance d1 may be 50 μm or less. The distance (a second distance d2 referring to FIG. 1) between the first intermediate insulating layer 25a and the second semiconductor body 50B is 200 µm or less. The second distance d2 may be 100 µm or less. The second distance d2 may be 50 µm or less.

An example of the semiconductor memory device 110 will now be described further with reference to FIG. 1.

As shown in FIG. 1, an insulating layer 23Ai is provided between the first semiconductor body 50A and the conductive layer 23. An insulating layer 23Bi is provided between the second semiconductor body 50B and the conductive layer 23. Transistors (e.g., source-side selection transistors STS) are formed at the portions where the conductive layer 23 and these semiconductor bodies 50 cross.

An insulating layer 24Ai is provided between the first semiconductor body 50A and the conductive layer 24. An insulating layer 24Bi is provided between the second semiconductor body 50B and the conductive layer 24. Transistors (e.g., drain-side selection transistors STD) are formed at the portions where the conductive layer 24 and these semiconductor bodies 50 cross.

A first conductive portion 57A and a second conductive portion 57B are further provided as shown in FIG. 1. The first conductive portion 57A extends through the first conductive layer 21a, the first partial region r1, and the second conductive layer 21b in the Z-axis direction. The first conductive portion 57A may spread along the Z-X plane. The second conductive portion 57B extends through the third conductive layer 21c, the second partial region r2, and the fourth conductive layer 21d in the Z-axis direction. The second conductive portion 57B may spread along the Z-X plane.

An end of the first conductive portion 57A is electrically connected to a second interconnect WR2. An end of the second conductive portion 57B is electrically connected to a third interconnect WR3. For example, the second interconnect WR2 and the third interconnect WR3 correspond to source lines SL. The third interconnect WR3 may be the same as the second interconnect WR2 or may be different.

An insulating portion 57Ai is provided between the first conductive portion 57A and the conductive layers 21. An insulating portion 57Bi is provided between the second conductive portion 57B and the conductive layers 21. The other end of the first conductive portion 57A and the other end of the second conductive portion 57B are electrically connected to the base semiconductor layer 10.

On the other hand, the other ends of the multiple semiconductor bodies 50 each are electrically connected to the base semiconductor layer 10.

One of the multiple semiconductor bodies 50 is selected by the control of the potentials of the source-side selection gate SGS and the drain-side selection gate SGD. One of the multiple memory cells MC included in one memory string is selected by the control of the potentials of the multiple word lines WL. The programming, erasing, and reading of the information are performed for the memory cell MC.

In the example, an insulating portion 27 is provided between the stacked body ML and the first interconnect WR1. For example, the first interconnect WR1 (the bit line) extends in the Y-axis direction. For example, the second interconnect WR2 and the third interconnect WR3 (the source lines SL) also extend in the Y-axis direction. For example, the position in the X-axis direction of the source line SL is different from the position in the X-axis direction of the bit line BL recited above. In the example, the position in the Z-axis direction of the source line SL is between the position in the Z-axis direction of the bit line BL and the position in the Z-axis direction of the stacked body ML.

In the embodiment, for example, a width w3 in the Y-axis direction of the intermediate insulating layer (e.g., one of the first intermediate insulating layer 25a or the second intermediate insulating layer 25b) (referring to FIG. 1) may be shorter than the first distance d1 (or the second distance d2) recited above.

As shown in FIG. 1, for example, the structure body that includes the first conductive portion 57A and the insulating portion 57Ai has a first width w1 along the Y-axis direction. The structure body that includes the second conductive portion 57B and the insulating portion 57Bi has a second width w2 along the Y-axis direction. For example, the width w3 recited above is about the same as the first width w1 and may be about the same as the second width w2. For example, the width w3 recited above may be not less than 0.5 times and not more than 2 times the first width w1 (or the second width w2).

Figure 3:
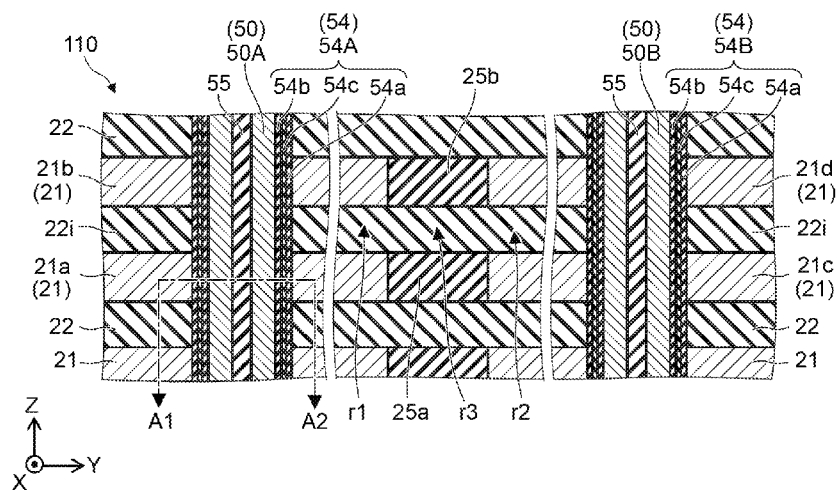
FIG. 3 and FIG. 4 are schematic cross-sectional views illustrating the semiconductor memory device according to the first embodiment.
Figure 4:
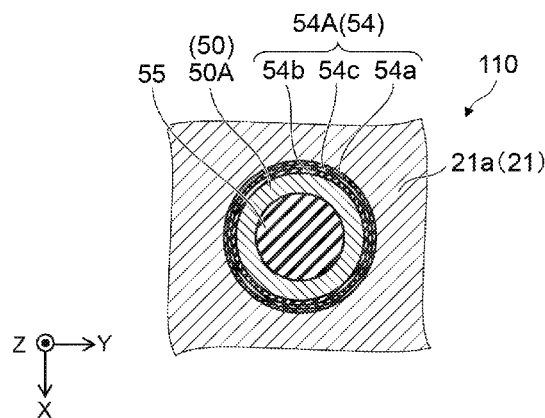

FIG. 3 and FIG. 4 are schematic cross-sectional views illustrating the semiconductor memory device according to the first embodiment.

FIG. 3 illustrates a portion of FIG. 1. FIG. 4 is a line A1-A2 cross-sectional view of FIG. 3.

As shown in FIG. 3 and FIG. 4, the first memory layer 54A (the memory layer 54) is provided between the first semiconductor body 50A (the semiconductor body 50) and the first conductive layer 21a (the conductive layer 21). The first memory layer 54A includes a first memory insulating film 54a, a memory film 54c, and a second memory insulating film 54b. The memory film 54c is provided between the first semiconductor body 50A and the first conductive layer 21a. The first memory insulating film 54a is provided between the memory film 54c and the first conductive layer 21a. The second memory insulating film 54b is provided between the memory film 54c and the first semiconductor body 50A.

Similarly, the second memory layer 54B also includes another first memory insulating film 54a, another memory film 54c, and another second memory insulating film 54b. The configuration of the second memory layer 54B is similar to that of the first memory layer 54A; and a description is therefore omitted.

For example, the first memory insulating film 54a functions as a blocking insulating film. For example, the second memory insulating film 54b functions as a tunneling insulating film. These insulating films include, for example, silicon oxide.

The memory film 54c is, for example, a charge storage layer. In such a case, the memory film 54c includes, for example, silicon nitride. The memory film 54c may be, for example, a floating electrode (a floating gate). In such a case, the memory film 54c includes polysilicon, etc.

Charge (e.g., electrons or the like) is stored or the charge is removed from the memory film 54c according to the information to be stored. The threshold voltage of the memory cell MC changes according to the amount of the charge stored in the memory film 54c. The information that is stored is read by sensing the threshold of the memory cell MC.

In the example, the semiconductor body 50 has a tubular configuration extending in the Z-axis direction; and a core insulating film 55 is provided on the inner side of the tube. The core insulating film 55 may be omitted.

An example of the method for manufacturing the semiconductor memory device 110 will now be described.

FIG. 5 to FIG. 11 are schematic cross-sectional views illustrating the method for manufacturing the semiconductor memory device according to the first embodiment.

Figure 5:
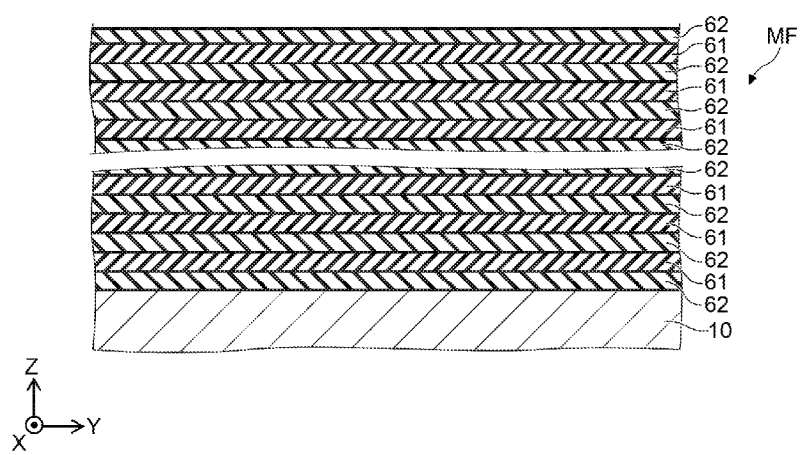
FIG. 5 is schematic cross-sectional views illustrating the method for manufacturing the semiconductor memory device according to the first embodiment.

As shown in FIG. 5, a stacked film MF is formed by alternately stacking a first film 61 and a second film 62 on the base semiconductor layer 10 (e.g., at least a portion of a semiconductor substrate). The stacked film MF includes the multiple first films 61 and the multiple second films 62. For example, the first film 61 includes silicon nitride; and the second film 62 includes silicon oxide. For example, these films can be formed by CVD (Chemical Vapor Deposition), etc.

Figure 6:
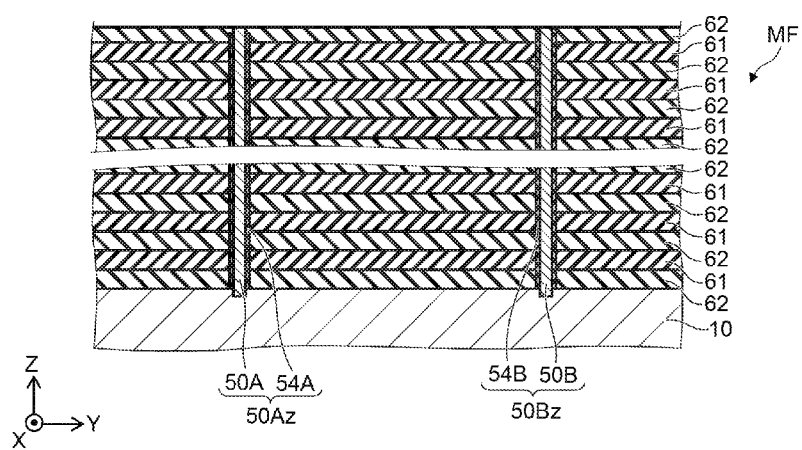
FIG. 6 is schematic cross-sectional views illustrating the method for manufacturing the semiconductor memory device according to the first embodiment.

As shown in FIG. 6, multiple pillar-shaped structure bodies (a first pillar-shaped structure body 50Az, a second pillar-shaped structure body 50Bz, etc.) are formed. The first pillar-shaped structure body 50Az includes the first semiconductor body 50A and the first memory layer 54A. The first semiconductor body 50A extends through the stacked film MF along the stacking direction of the stacked film MF (the Z-axis direction). The first memory layer 54A is provided between the first semiconductor body 50A and the stacked film MF. The second pillar-shaped structure body 50Bz includes the second semiconductor body 50B and the second memory layer 54B. The second semiconductor body 50B extends through the stacked film MF along the stacking direction. The second memory layer 54B is provided between the second semiconductor body 50B and the stacked film MF. For example, these structure bodies are formed by forming holes by RIE (Reactive Ion Etching) and by forming films by CVD, etc.

Figure 7:
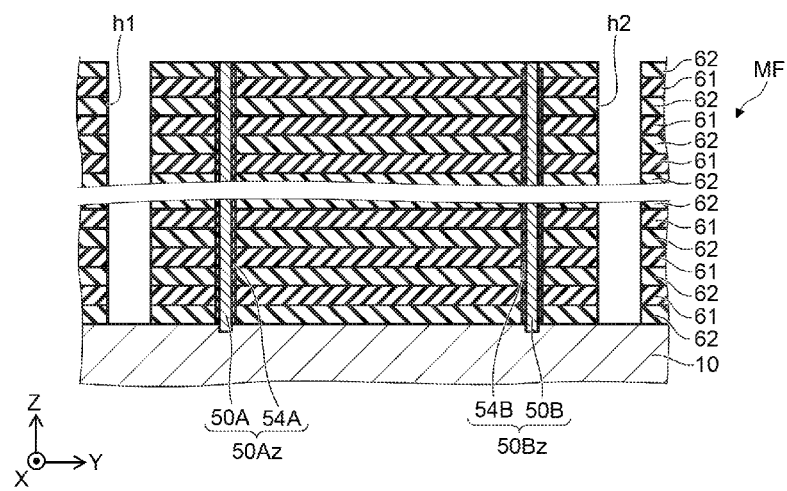
FIG. 7 is schematic cross-sectional views illustrating the method for manufacturing the semiconductor memory device according to the first embodiment.

As shown in FIG. 7, holes (holes h1 and h2, etc.) are formed in the stacked film MF. The holes may be slits. In the case where the holes are slits, conductive portions having plate configurations may be formed inside the holes in a subsequent process.

Figure 8:
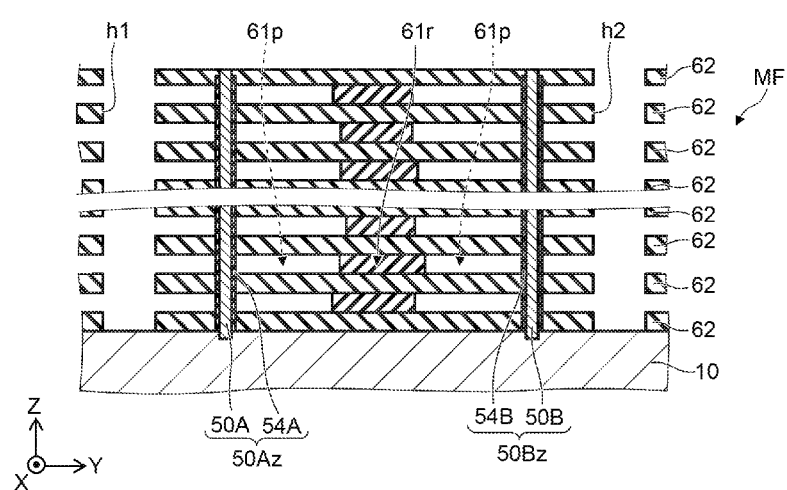
FIG. 8 is schematic cross-sectional views illustrating the method for manufacturing the semiconductor memory device according to the first embodiment.

As shown in FIG. 8, a third portion 61r of the multiple first films 61 is caused to remain while removing a first portion 61p and a second portion 61q of the multiple first films 61 via the holes h1 and h2. The third portion 61r is positioned between the first pillar-shaped structure body 50Az and the second pillar-shaped structure body 50Bz. The first portion 61p is positioned between the third portion 61r and the first pillar-shaped structure body 50Az. The second portion 61q is positioned between the third portion 61r and the second pillar-shaped structure body 50Bz.

As shown in FIG. 8, the positions in the Y-axis direction of the end portions in the Y-axis direction of the remaining multiple third portions 61r may be different from each other between the multiple third portions 61r.

Subsequently, conductive layers are formed by filling a conductive material into the space formed by removing the first films 61 recited above. As recited below, in the example, the third film and the fourth film recited below are formed prior to forming the conductive layers.

Figure 9:
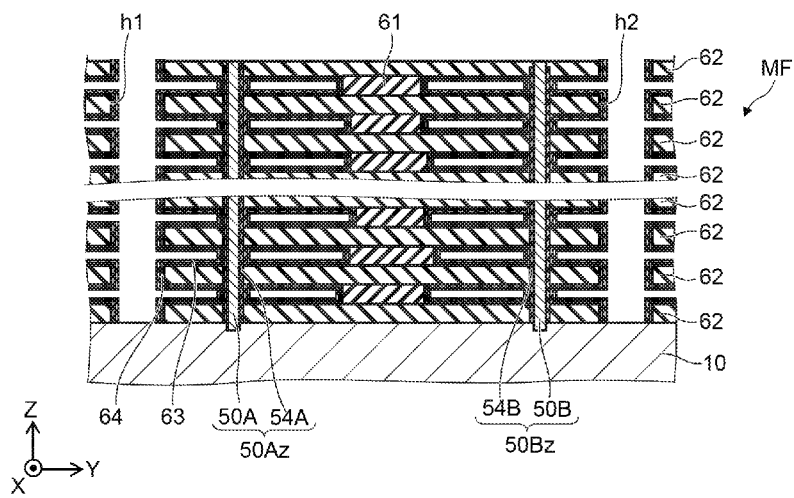
FIG. 9 is schematic cross-sectional views illustrating the method for manufacturing the semiconductor memory device according to the first embodiment.

As shown in FIG. 9, a fourth film 64 is formed after removing a portion of the first films 61. The fourth film 64 includes an oxide including at least one selected from the group consisting of aluminum and hafnium. The fourth film 64 is, for example, an aluminum oxide film. Subsequently, a third film 63 is formed. The third film 63 is, for example, a barrier metal film of TiN, etc.

Thus, the manufacturing method may further include, between the removing of the first portion 61p and the second portion 61q and the introducing of the conductive material described below, forming the third film 63 in at least a portion on the multiple second films 62, on the first pillar-shaped structure body 50Az, and on the second pillar-shaped structure body 50Bz inside the space formed by removing the first portion 61p and the second portion 61q.

Also, the manufacturing method may further include, between the forming of the third film 63 and the introducing of the conductive material described below, forming the fourth film 64 on the third film 63 inside the space formed by removing the first portion 61p and the second portion 61q. For example, the fourth film 64 recited above may be used as at least a portion of the gate insulating film of the selection transistor. For example, the dielectric constant of the fourth film 64 is higher than the dielectric constant of the second film 62.

Figure 10:
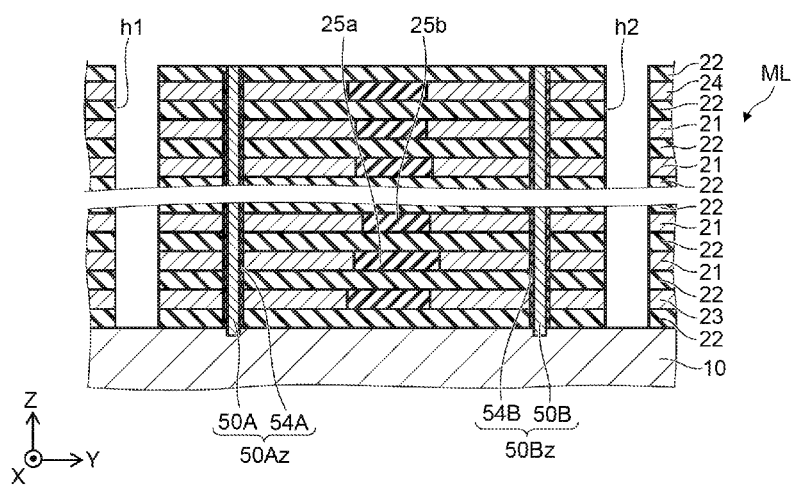
FIG. 10 is schematic cross-sectional views illustrating the method for manufacturing the semiconductor memory device according to the first embodiment.

As shown in FIG. 10, multiple conductive layers are formed from a conductive material (e.g., a material including tungsten, etc.) by introducing the conductive material into at least a portion of the space formed by the removing of the first portion 61p and the second portion 61q recited above. A portion of the multiple conductive layers is used as the multiple conductive layers 21. Another portion of the multiple conductive layers is used as the conductive layer 23. Another portion of the multiple conductive layers is used as the conductive layer 24. The multiple second films 62 correspond to the insulating layers 22. Thereby, the stacked body ML is formed. Thus, a replacement method is used in this method.

The third portion 61r of the multiple first films 61 becomes the intermediate insulating layers (e.g., the first intermediate insulating layer 25a, the second intermediate insulating layer 25b, etc.).

Figure 11:
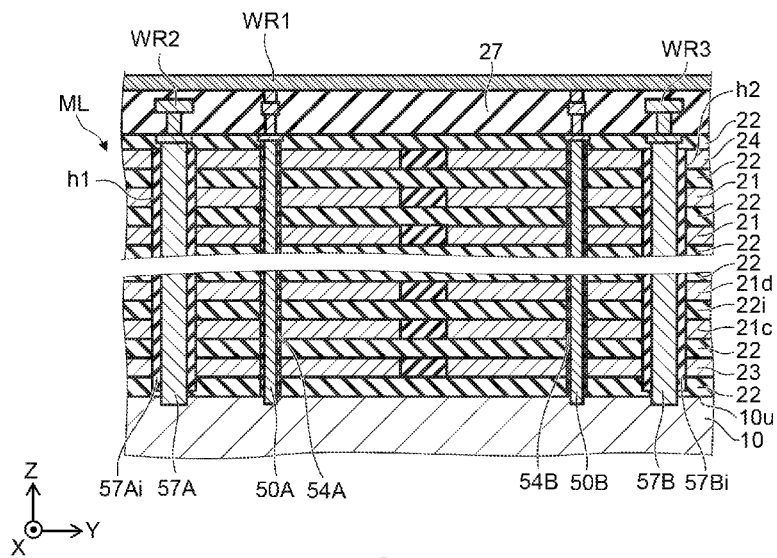
FIG. 11 is schematic cross-sectional views illustrating the method for manufacturing the semiconductor memory device according to the first embodiment.

As shown in FIG. 11, the insulating portion 57Ai and the insulating portion 57Bi are formed respectively inside the hole h1 and the hole h2. Further, the conductive portion 57A, the conductive portion 57B, etc., are formed by introducing a conductive material (e.g., a material including tungsten, etc.) to the remaining space.

Further, the second interconnect WR2 and the third interconnect WR3 are formed on the stacked body ML. Further, the insulating portion 27 is formed; and the first interconnect WR1 is formed on the insulating portion 27. Thus, the manufacturing method further includes forming an interconnect (the first interconnect WR1) that is electrically connected to the first semiconductor body 50A and the second semiconductor body 50B.

Thereby, the semiconductor memory device 110 can be formed.

Figure 12:
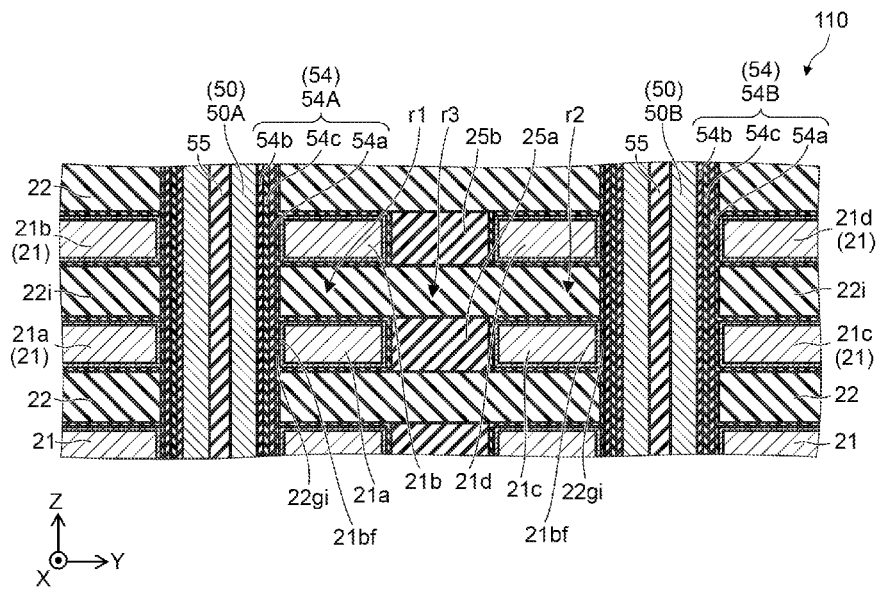
FIG. 12 is a schematic cross-sectional view illustrating the semiconductor memory device according to the first embodiment.

FIG. 12 is a schematic cross-sectional view illustrating the semiconductor memory device according to the first embodiment.

FIG. 12 illustrates a portion of the semiconductor memory device 110 made by the method for the manufacturing recited above.

As shown in FIG. 12, the semiconductor memory device 110 further includes a barrier metal film 21bf. For example, the barrier metal film 21bf is provided between the first conductive layer 21a and the first memory layer 54A. The barrier metal film 21bf includes TiN, etc. For example, the barrier metal film 21bf is provided also between the third conductive layer 21c and the second memory layer 54B. The barrier metal film 21bf is provided between the memory layer 54 (including the first memory layer 54A, the second memory layer 54B, etc.) and the multiple conductive layers 21, the conductive layer 23, and the conductive layer 24.

The barrier metal film 21bf may be provided also between the first intermediate insulating layer 25a and the first conductive layer 21a. For example, at least a portion of the region between the first intermediate insulating layer 25a and the first conductive layer 21a may include the same material as the barrier metal film 21*bf*. For example, the barrier metal film 21*bf* is formed from the third film 63 described above.

The semiconductor memory device 110 further includes a first intermediate film 22*gi*. The first intermediate film 22*gi* is provided between the first conductive layer 21*a* and the first memory layer 54A. For example, the first intermediate film 22*gi* is provided between the first memory layer 54A and the barrier metal film 21*bf*. The first intermediate film 22*gi* includes, for example, aluminum oxide, etc. For example, the dielectric constant of the first intermediate film 22*gi* is higher than the dielectric constant of the first intermediate insulating layer 25*a*. For example, the barrier metal film 21*bf* is provided between the first intermediate film 22*gi* and the first conductive layer 21*a*.

For example, the barrier metal film 21*bf* may be provided between the first intermediate insulating layer 25*a* and the first intermediate film 22*gi*. For example, at least a portion of the region between the first intermediate insulating layer 25*a* and the first conductive layer 21*a* may include an oxide.

On the other hand, the conductive layers 21 (e.g., the first conductive layer 21*a*, etc.) include tungsten, etc.

Second Embodiment

Figure 13:
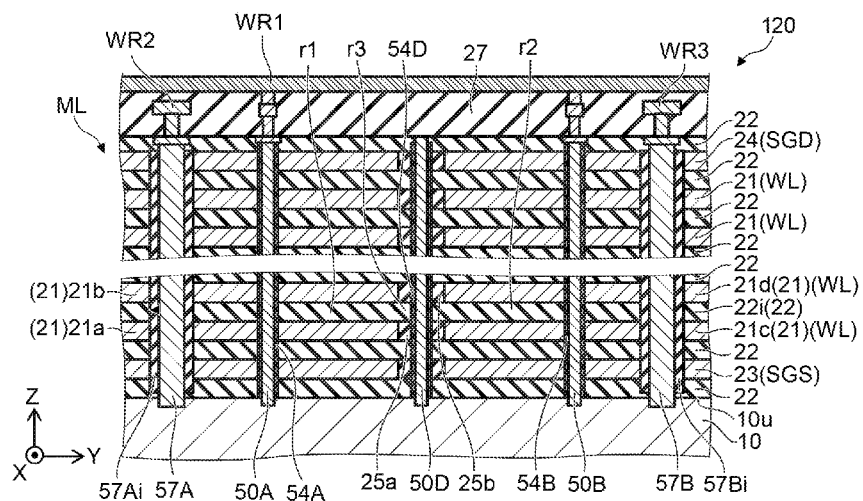
FIG. 13 is a schematic cross-sectional view illustrating a semiconductor memory device according to a second embodiment.

FIG. 13 is a schematic cross-sectional view illustrating a semiconductor memory device according to a second embodiment.

As shown in FIG. 13, the semiconductor memory device 120 according to the embodiment also includes the first to fourth conductive layers 21*a* to 21*d*, the first intermediate insulating layer 25*a*, the second intermediate insulating layer 25*b*, the inter-layer insulating layers 22*i*, the first semiconductor body 50A, the second semiconductor body 50B, the first memory layer 54A, the second memory layer 54B, and the first interconnect WR1. Also, the semiconductor memory device 120 further includes an intermediate semiconductor body 50D and the insulating portion 27. The portions other than the intermediate semiconductor body 50D and the insulating portion 27 are similar to those of the semiconductor memory device 110; and a description is therefore omitted.

The intermediate semiconductor body 50D extends through the first intermediate insulating layer 25*a*, the second intermediate insulating layer 25*b*, and the intermediate partial region r3 in the Z-axis direction. The insulating portion 27 is provided between the intermediate semiconductor body 50D and the first interconnect WR1 in the Z-axis direction. The intermediate semiconductor body 50D is electrically insulated from the first interconnect WR1 by the insulating portion 27. The intermediate semiconductor body 50D may be electrically insulated from at least one of the first interconnect WR1 or the base semiconductor layer 10.

In the semiconductor memory device 120 as well, stable electrical characteristics are obtained because the first intermediate insulating layer 25*a* and the second intermediate insulating layer 25*b* are provided. For example, the reliability of the operations can be increased.

A memory material film 54D is further provided in the example. The memory material film 54D is provided between the first intermediate insulating layer 25*a* and the intermediate semiconductor body 50D and between the second intermediate insulating layer 25*b* and the intermediate semiconductor body 50D. The memory material film 54D includes, for example, a material included in the first memory layer 54A.

For example, the intermediate semiconductor body 50D and the memory material film 54D are formed simultaneously when forming, for example, the first semiconductor body 50A, the first memory layer 54A, the second semiconductor body 50B, and the second memory layer 54B. In other words, the multiple semiconductor bodies 50 and the memory layers 54 are formed; the first films 61 at the peripheries of a portion of the multiple semiconductor bodies 50 and the memory layers 54 are removed; and the conductive layers 21 recited above, etc., are formed. Then, the first films 61 (and the second films 62) that are at the periphery of another portion of the multiple semiconductor bodies 50 and the memory layers 54 are caused to remain to become the dummy stacked body. The semiconductor body 50 and the memory layer 54 that are formed in the dummy stacked body become the intermediate semiconductor body 50D and the memory material film 54D. For example, the first interconnect WR1 (e.g., the bit line BL) may not be connected to the intermediate semiconductor body 50D.

Figure 14:
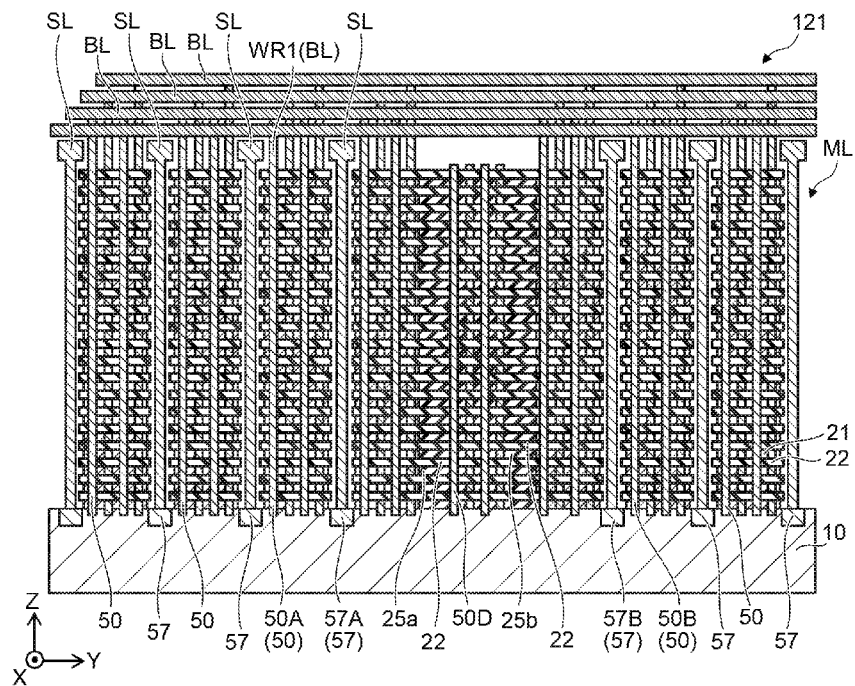
FIG. 14 is a schematic view illustrating another semiconductor memory device according to the second embodiment.

FIG. 14 is a schematic view illustrating another semiconductor memory device according to the second embodiment.

In the semiconductor memory device 121 as shown in FIG. 14, the multiple semiconductor bodies 50 extend through the stacked body ML. Several of the multiple semiconductor bodies 50 are connected to each of the multiple bit lines BL. Multiple conductive portions 57 (source members) are provided; and the upper end portions of the multiple conductive portions 57 are connected to the source lines SL. For example, a portion of the multiple conductive portions 57 is omitted; and the intermediate semiconductor body 50D is provided instead. The intermediate insulating layers (the first intermediate insulating layer 25*a*, the second intermediate insulating layer 25*b*, etc.) are provided in the portion where the intermediate semiconductor body 50D is provided. The multiple intermediate insulating layers and the insulating layers 22 are stacked alternately.

Figure 15:
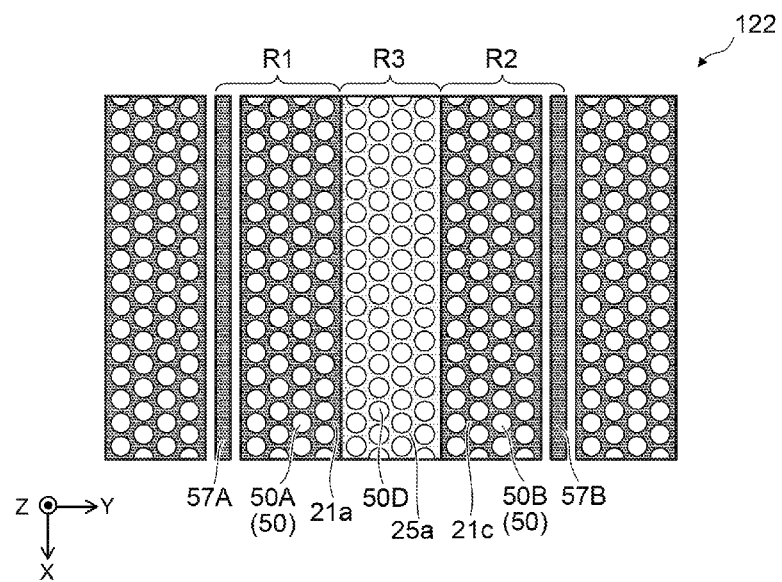
FIG. 15 is a schematic plan view illustrating another semiconductor memory device according to the second embodiment.

FIG. 15 is a schematic plan view illustrating another semiconductor memory device according to the second embodiment.

As shown in FIG. 15, the semiconductor memory device 122 according to the embodiment includes a first memory partial region R1, a second memory partial region R2, and a non-memory partial region R3. The first memory partial region R1 includes, for example, the first semiconductor bodies 50A. The second memory partial region R2 includes, for example, the second semiconductor bodies 50B. The non-memory partial region R3 is provided between the first memory partial region R1 and the second memory partial region R2. The intermediate semiconductor bodies 50D are provided in the non-memory partial region R3. The first intermediate insulating layers 25*a* (e.g., the silicon nitride layers) are provided around the intermediate semiconductor bodies 50D. The conductive layers (the first conductive layer 21*a*, the third conductive layer 21*c*, etc., e.g., the tungsten layers, etc.) are provided in the first memory partial region R1 and the second memory partial region R2.

Figure 16:
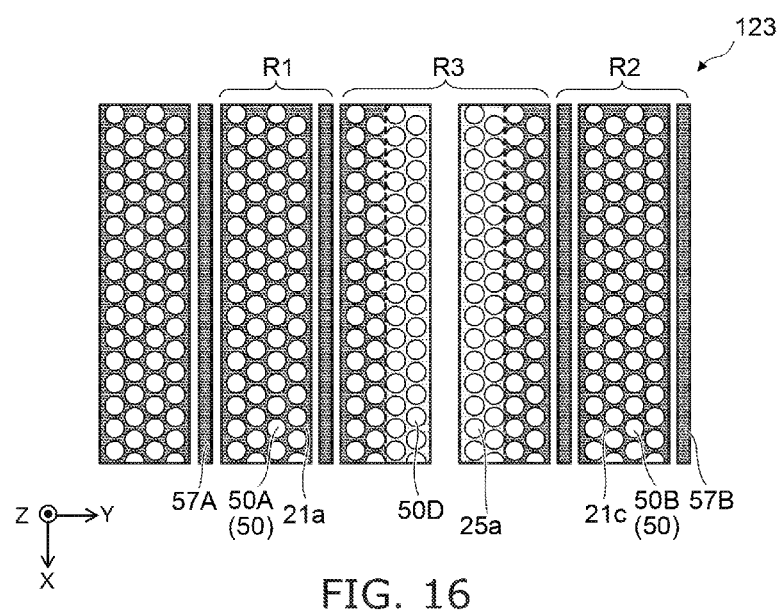
FIG. 16 is a schematic plan view illustrating another semiconductor memory device according to the second embodiment.

FIG. 16 is a schematic plan view illustrating another semiconductor memory device according to the second embodiment.

In the semiconductor memory device 123 according to the embodiment as shown in FIG. 16, the first intermediate insulating layers 25*a* (e.g., the silicon nitride layers) are provided around the intermediate semiconductor bodies 50D in a portion of the non-memory partial region R3. Then, in another portion of the non-memory partial region R3, layers of a material similar to the conductive layers (the first conductive layer 21a, the third conductive layer 21c, etc., e.g., the tungsten layers, etc.) are provided around the intermediate semiconductor bodies 50D.

In the semiconductor memory devices 121 to 123 as well, for example, the reliability of the operations can be increased because the first intermediate insulating layer 25a and the second intermediate insulating layer 25b are provided.

In the embodiment, for example, a stacked film that includes silicon nitride films and silicon oxide films is caused to remain inside the cell array. For example, the stacked film is utilized as a hydrogen supply source. For example, when forming the semiconductor memory device by a replacement method, a SiN/SiO$_2$ structure is caused to remain by not replacing a portion of the structure. It is considered that the characteristics improve due to the hydrogen supplied from the SiN.

For example, in the embodiment, multiple dummy blocks that include stacked films including silicon nitride films and silicon oxide films are provided in the "plane." For example, a slit (a hole) for replacing the SiN films inside the stacked film is provided. For example, in the dummy block portions, the SiN remains in the dummy block portions by omitting the slit. For example, the dummy blocks may be arranged at uniform spacing. For example, the distance between the multiple dummy blocks is 50 μm or less. At least a portion of at least one of the multiple dummy blocks includes a silicon nitride film and a silicon oxide film.

Figure 17:
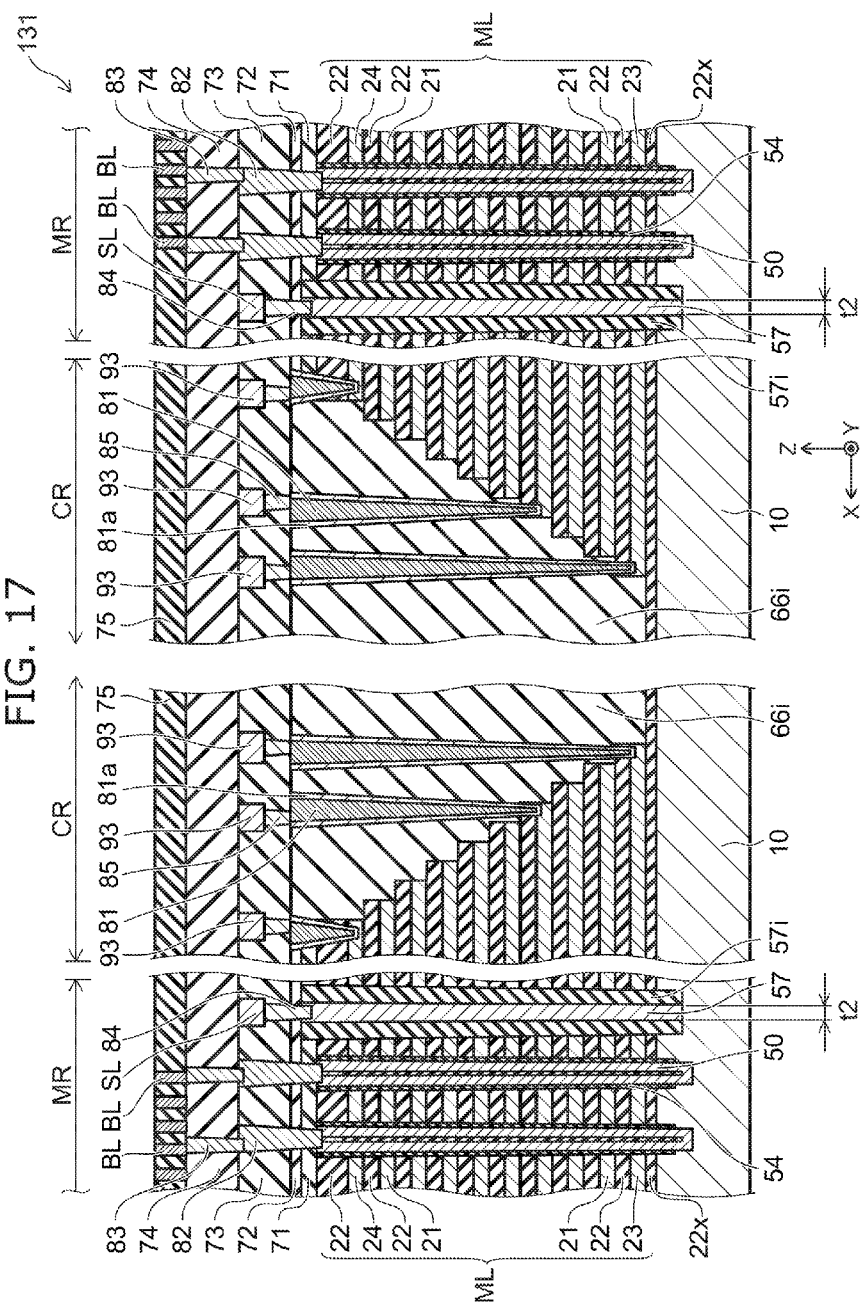
FIG. 17 is a schematic cross-sectional view illustrating the semiconductor memory device according to the embodiment.

FIG. 17 is a schematic cross-sectional view illustrating the semiconductor memory device according to the embodiment.

FIG. 17 also illustrates a connection region CR in addition to the memory region MR of the semiconductor memory device according to the embodiment.

As shown in FIG. 17, the base semiconductor layer 10 (e.g., the semiconductor substrate) is provided in the semiconductor memory device 131 according to the embodiment. In the example, an insulating layer 22x is provided on the base semiconductor layer 10.

In the memory region MR, the stacked body ML is provided on the insulating layer 22x. Also, the semiconductor body 50, the memory layer 54, and the conductive portion 57 are provided. The conductive portion 57 is used as a source member. The conductive layer 23 is provided at the lower portion of the stacked body ML; and the conductive layer 24 is provided at the upper portion. The multiple conductive layers are provided between the conductive layer 23 and the conductive layer 24. The insulating layers 22 are provided between these conductive layers. The conductive layer 23 is used as the source-side selection gate SGS (e.g., the lower selection gate). The conductive layer 24 is used as the drain-side selection gate SGD (e.g., the upper selection gate). The memory layer 54 is provided between the stacked body ML and the semiconductor body 50.

The semiconductor body 50 is electrically connected to the base semiconductor layer 10. The conductive portion 57 extends through the stacked body ML in the Z-axis direction. The conductive portion 57 may spread along the Z-X plane. The semiconductor body 50 and the conductive portion 57 are electrically connected via the base semiconductor layer 10.

The conductive portion 57 includes a metal (e.g., tungsten, etc.). The conductive portion 57 may include, for example, a semiconductor (polysilicon including an impurity, etc.). An insulating film 57i is provided between the conductive portion 57 and the stacked body ML.

An insulating film 71 is provided on the stacked body ML. An insulating film 72 is provided on the insulating film 71. An insulating film 73 is provided on the insulating film 72. An insulating film 74 is provided on the insulating film 73. An insulating film 75 is provided on the insulating film 74.

In the connection region CR, the end portions of the multiple conductive layers 21 have a staircase configuration. A connecting body 81 (e.g., a contact plug) is provided on each of the multiple conductive layers 21. For example, the connecting body 81 has a columnar configuration extending in the Z-axis direction. The connecting body 81 is electrically connected to one of the multiple conductive layers 21. The connecting body 81 includes a conductive material (e.g., tungsten, etc.). An insulating portion 66i is provided at the periphery of the connecting body 81.

A barrier metal film 81a is provided between the connecting body 81 and the insulating portion 66i. The barrier metal film 81a is provided also between the connecting body 81 and the conductive layer 21 electrically connected to the connecting body 81. The barrier metal film 81a is a film including a metal. The barrier metal film 81a includes, for example, titanium. The barrier metal film 81a may be a film including titanium nitride.

In the memory region MR, a connecting body 82 is provided on the semiconductor body 50. A connecting body 83 is provided on the connecting body 82. For example, the multiple bit lines BL that extend in the Y-axis direction are provided on the connecting body 83. The semiconductor body 50 and one of the multiple bit lines BL are electrically connected via the connecting bodies 82 and 83.

A connecting body 84 is provided on the conductive portion 57. The source line SL is provided on the connecting body 84. The conductive portion 57 and the source line SL are connected via the connecting body 84.

In the connection region CR, a connecting body 85 is provided on the connecting body 81. For example, an interconnect 93 that extends in the Y-axis direction is provided on the connecting body 85. The connecting body 81 and the interconnect 93 are connected via the connecting body 85. The connecting bodies 82, 83, 84, and 85 are, for example, contact plugs.

The first memory insulating film 54a and the second memory insulating film 54b may include, for example, at least one of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO. The memory film 54c includes, for example, silicon nitride.

Figure 18:
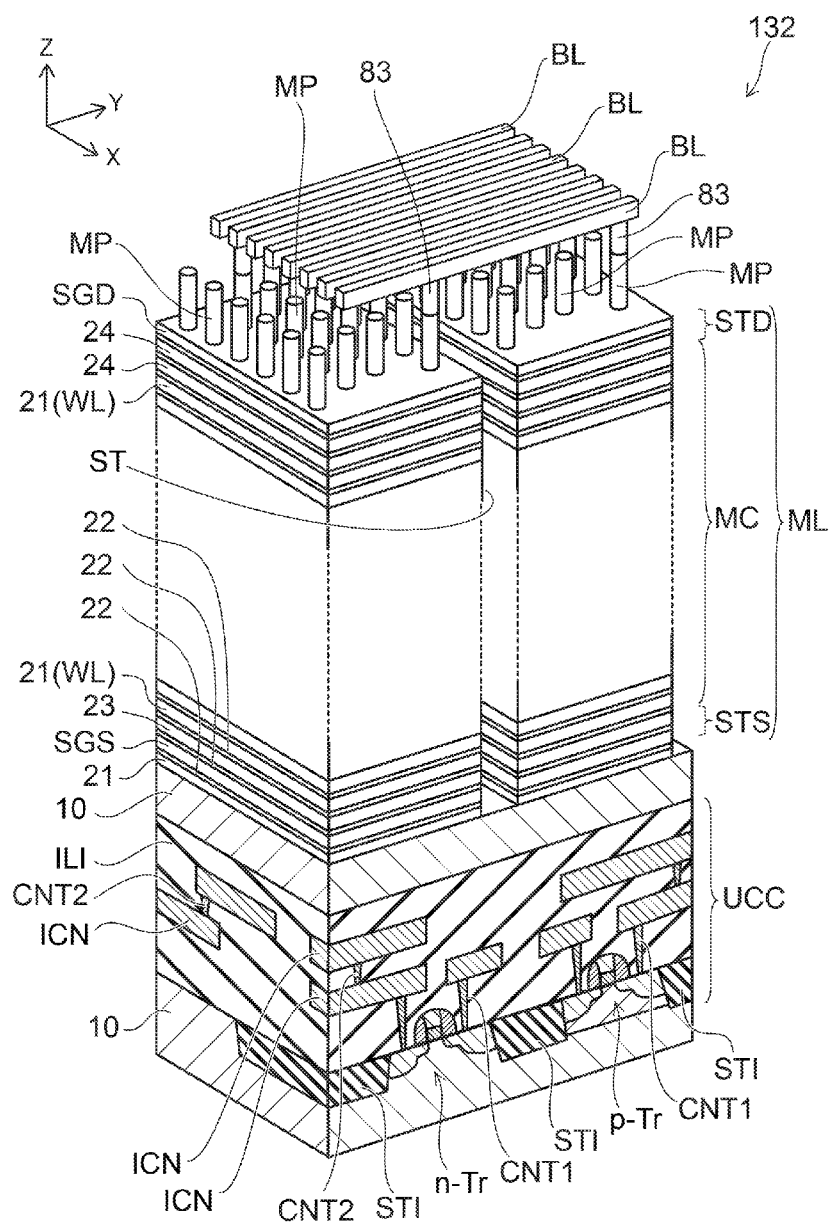
FIG. 18 is a schematic perspective view illustrating the semiconductor memory device according to the embodiment.

FIG. 18 is a schematic perspective view illustrating the semiconductor memory device according to the embodiment.

In the semiconductor memory device 132 as shown in FIG. 18, the base semiconductor layer 10 is provided in the upper portion of a silicon substrate 10s; and the stacked body ML is provided on the base semiconductor layer 10. The source-side selection transistor STS is provided in the lower portion of the stacked body ML; and the drain-side selection transistor STD is provided in the upper portion. Multiple pillar-shaped structure bodies MP extend through the stacked body ML. The pillar-shaped structure bodies MP include the memory layer 54 and the semiconductor body 50. In the drawing, a slit ST is provided between two stacked bodies ML; and the conductive portion 57 recited above (not illustrated in FIG. 18) is provided in the slit ST. The source line SL is not illustrated in the drawing.

In the silicon substrate 10s, the base semiconductor layer 10 is provided on an inter-layer insulating film ILI. The inter-layer insulating film ILI includes, for example, silicon oxide. An under-cell circuit UCC (e.g., a peripheral circuit) is provided in the silicon substrate 10s. The under-cell circuit UCC includes a drive circuit. For example, the drive circuit performs the programming, reading, and erasing of the data to and from the transistors of the memory cells MC. For example, the under-cell circuit UCC includes a sense amplifier.

For example, the silicon substrate 10s is subdivided into multiple active areas by an insulating portion STI (Shallow Trench Isolation). In one active area, an n-type transistor n-Tr (a MOSFET (Metal-Oxide-Semiconductor Field-Effect Transistor)) is provided. In one other active area, a p-type transistor p-Tr (a MOSFET) is provided. Multiple interconnects ICN are provided in multilayers inside the inter-layer insulating film ILI. Further, connection members CNT1 that connect the multiple interconnects ICN to the silicon substrate 10s are provided. Further, connection members CNT2 that connect the multiple interconnects ICN to each other are provided.

In the semiconductor memory device 132, because the under-cell circuit UCC (e.g., the peripheral circuit) is provided in the portion under the memory cells MC, the surface area of the semiconductor memory device 132 can be reduced. In the semiconductor memory device 132, any configuration described in reference to the first embodiment or the second embodiment or a modification of the configuration is applicable to the configuration of the memory region MR.

According to the embodiments, a semiconductor memory device and a method for manufacturing the semiconductor memory device can be provided in which the reliability of the operations can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory cells, semiconductor bodies, memory layers, intermediate insulating layers, inter-layer insulating layers, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices, and methods for manufacturing the same practicable by an appropriate design modification by one skilled in the art based on the semiconductor memory devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first conductive layer;
   a second conductive layer separated from the first conductive layer in a first direction;
   a third conductive layer arranged with the first conductive layer in a second direction crossing the first direction;
   a fourth conductive layer separated from the third conductive layer in the first direction and arranged with the second conductive layer in the second direction;
   a first intermediate insulating layer provided between the first conductive layer and the third conductive layer;
   a second intermediate insulating layer provided between the second conductive layer and the fourth conductive layer;
   an inter-layer insulating layer including an intermediate partial region, the intermediate partial region being between the first intermediate insulating layer and the second intermediate insulating layer;
   a first semiconductor body extending through the first conductive layer and the second conductive layer in the first direction;
   a first memory layer provided between the first conductive layer and the first semiconductor body;
   a second semiconductor body extending through the third conductive layer and the fourth conductive layer in the first direction;
   a second memory layer provided between the third conductive layer and the second semiconductor body; and
   a first interconnect electrically connected to the first semiconductor body and the second semiconductor body,
   at least one of the first intermediate insulating layer or the second intermediate insulating layer including a material different from a material of the intermediate partial region.

2. The semiconductor memory device according to claim 1, wherein
   the first intermediate insulating layer and the second intermediate insulating layer include silicon nitride, and
   the intermediate partial region includes silicon oxide.

3. The semiconductor memory device according to claim 2, wherein
   the inter-layer insulating layer further includes a first partial region and a second partial region, the first partial region being between the first conductive layer and the second conductive layer, the second partial region being between the third conductive layer and the fourth conductive layer, and
   the first partial region and the second partial region include silicon oxide.

4. The semiconductor memory device according to claim 3, wherein the intermediate partial region is continuous with the first partial region and continuous with the second partial region.

5. The semiconductor memory device according to claim 1, wherein a concentration of nitrogen of at least one of the first intermediate insulating layer or the second intermediate insulating layer is higher than a concentration of nitrogen in the intermediate partial region.

6. The semiconductor memory device according to claim 1, wherein a concentration of oxygen in the intermediate partial region is higher than a concentration of oxygen of at least one of the first intermediate insulating layer or the second intermediate insulating layer.

7. The semiconductor memory device according to claim 1, further comprising a barrier metal film provided between the first conductive layer and the first memory layer,
at least a portion of a region between the first intermediate insulating layer and the first conductive layer including a same material as the barrier metal film.

8. The semiconductor memory device according to claim 1, further comprising a first intermediate film provided between the first conductive layer and the first memory layer,
a dielectric constant of the first intermediate film being higher than a dielectric constant of the first intermediate insulating layer, and
at least a portion of a region between the first intermediate insulating layer and the first conductive layer including same material as the first intermediate film.

9. The semiconductor memory device according to claim 1, further comprising:
an intermediate semiconductor body extending through the first intermediate insulating layer, the second intermediate insulating layer, and the intermediate partial region in the first direction; and
an insulating portion provided between the intermediate semiconductor body and the first interconnect in the first direction.

10. The semiconductor memory device according to claim 9, wherein the intermediate semiconductor body is electrically insulated from at least one of the first interconnect or the base semiconductor layer.

11. The semiconductor memory device according to claim 9, further comprising a memory material film provided between the first intermediate insulating layer and the intermediate semiconductor body, the memory material film including a material included in the first memory layer.

12. The semiconductor memory device according to claim 1, wherein a distance between the first intermediate insulating layer and the first semiconductor body is 200 micrometers or less.

13. The semiconductor memory device according to claim 1, wherein a distance between the first intermediate insulating layer and the first semiconductor body is 100 micrometers or less.

14. The semiconductor memory device according to claim 1, wherein a distance between the first intermediate insulating layer and the first semiconductor body is 50 micrometers or less.

15. The semiconductor memory device according to claim 1, wherein
the first memory layer includes:
a memory film;
a first memory insulating film provided between the memory film and the first conductive layer; and
a second memory insulating film provided between the memory film and the first semiconductor body.

16. A method for manufacturing a semiconductor memory device, comprising:

forming a stacked film by alternately stacking a first film and a second film on a base semiconductor layer, the stacked film including a plurality of the first films and a plurality of the second films;
forming a first pillar-shaped structure body and a second pillar-shaped structure body, the first pillar-shaped structure body including a first semiconductor body and a first memory layer, the first semiconductor body extending through the stacked film along a stacking direction of the stacked film, the first memory layer being provided between the first semiconductor body and the stacked film, the second pillar-shaped structure body including a second semiconductor body and a second memory layer, the second semiconductor body extending through the stacked film along the stacking direction, the second memory layer being provided between the second semiconductor body and the stacked film;
forming a hole in the stacked film;
causing a third portion of the plurality of first films to remain while removing a first portion and a second portion of the plurality of first films via the hole, the third portion being positioned between the first pillar-shaped structure body and the second pillar-shaped structure body, the first portion being positioned between the third portion and the first pillar-shaped structure body, the second portion being positioned between the third portion and the second pillar-shaped structure body;
forming a plurality of conductive layers from a conductive material by introducing the conductive material to at least a portion of a space formed by the removing of the first portion and the second portion; and
forming an interconnect electrically connected to the first semiconductor body and the second semiconductor body.

17. The method for manufacturing the semiconductor memory device according to claim 16, wherein
the first film includes silicon nitride, and
the second film includes silicon oxide.

18. The method for manufacturing the semiconductor memory device according to claim 16, further comprising forming a third film inside the space on at least a portion of the plurality of second films, the first pillar-shaped structure body, and the second pillar-shaped structure body, the forming of the third film being performed between the removing of the first portion and the second portion and the introducing of the conductive material, the third film including TiN.

19. The method for manufacturing the semiconductor memory device according to claim 18, further comprising forming a fourth film inside the space between the forming of the third film and the introducing of the conductive material, the fourth film including an oxide including at least one selected from the group consisting of aluminum and hafnium.

20. The method for manufacturing the semiconductor memory device according to claim 18, further comprising forming a fourth film inside the space between the forming of the third film and the introducing of the conductive material, the fourth film including an oxide,
a dielectric constant of the fourth film being higher than a dielectric constant of the second film.

* * * * *